United States Patent [19]

Pandya

[11] Patent Number: 5,290,715
[45] Date of Patent: Mar. 1, 1994

[54] METHOD OF MAKING DIELECTRICALLY ISOLATED METAL BASE TRANSISTORS AND PERMEABLE BASE TRANSISTORS

[75] Inventor: Ranjana Pandya, New Paltz, N.Y.
[73] Assignee: U.S. Philips Corporation, New York, N.Y.
[21] Appl. No.: 815,689
[22] Filed: Dec. 31, 1991
[51] Int. Cl.⁵ .......................................... H01L 21/265
[52] U.S. Cl. ...................................... 437/29; 437/62; 437/31; 437/228; 148/DIG. 12
[58] Field of Search ................. 437/200, 29, 26, 24, 437/62.2, 65, 245, 31, 63; 148/DIG. 12

[56] References Cited

U.S. PATENT DOCUMENTS

| | | | |
|---|---|---|---|
| 4,477,308 | 10/1984 | Gibson et al. | 156/612 |
| 4,555,301 | 11/1985 | Gibson et al. | 148/DIG. 140 |
| 4,707,197 | 11/1987 | Hensel et al. | 437/200 |
| 4,758,534 | 7/1988 | Derkits et al. | 148/DIG. 142 |
| 4,816,421 | 3/1989 | Dynes et al. | 437/26 |
| 4,983,251 | 1/1991 | Haisma et al. | 156/630 |
| 5,036,021 | 7/1991 | Goto | 437/62 |
| 5,236,872 | 8/1993 | van Ommen et al. | 437/24 |

*Primary Examiner*—Olik Chaudhuri
*Assistant Examiner*—Ramamohan Rao Paladugu
*Attorney, Agent, or Firm*—William L. Botjer

[57] ABSTRACT

The invention is directed to method for making a dielectrically isolated metal base transistors and permeable base transistors. The first step is the production of a silicon/metal silicide/silicon heterostructure. Thereafter the surface of the heterostructure is oxidized so as to provide a bonding surface. A second silicon substrate has its surface oxidized and is bonded to the heterostructure. The surface of the heterostructure is then etched back so as to expose individual transistors which are disposed on the oxidized surface of the second substrate. With suitable processing of the metal silicide layer it may act as the base region for a metal base or permeable base transistor.

6 Claims, 1 Drawing Sheet

METHOD OF MAKING DIELECTRICALLY ISOLATED METAL BASE TRANSISTORS AND PERMEABLE BASE TRANSISTORS

BACKGROUND OF THE INVENTION

This invention relates to methods of manufacturing metal base transistors and permeable base transistors. Specifically, this invention relates to a method for making dielectrically isolated metal base transistors and permeable base transistors.

Recently, because of their superior high frequency and high current gain characteristics, interest has been generated in metal base transistors, which are transistors in which the base of the transistor is a metal, or more particularly a metal silicide such as cobalt silicide. Furthermore, a variant of the metal base transistor, known as the permeable base transistor is also of interest as it also has favorable operating characteristics. In a permeable base transistor the electrons will tunnel directly through so-called "pin holes" in the metal base. Both of these transistors have high gain and fast response characteristics which makes them particularly suitable for high frequency applications.

For high frequency operation each of the metal base or permeable base transistors must be dielectrically isolated from the others. The most common method for providing dielectric isolation to these transistors has been by p-n doping of the underlying substrate. However, the individual transistor and its accompanying doping region has a small, but far from insignificant, capacitance. Furthermore, the effect of this residual capacitance becomes significant at higher and higher frequencies. This capacitance will limit the effective speed of the device. The present invention is directed towards a method of making metal base transistors and permeable base transistors which are completely dielectrically isolated.

SUMMARY OF THE INVENTION

The invention is directed to method for making a dielectrically isolated metal base transistors and permeable base transistors. The first step is the production of a silicon/metal silicide/silicon heterostructure. Thereafter the surface of the heterostructure is oxidized so as to provide a bonding surface. A second silicon substrate has its surface oxidized and is bonded to the heterostructure. The surface of the heterostructure is then etched back so as to expose individual transistors which are disposed on the oxidized surface of the second substrate. With suitable processing of the metal silicide layer it may either act as the base region for a metal base or a permeable base transistor.

BRIEF DESCRIPTION OF THE DRAWINGS

For better understanding of the invention, reference is made to the following drawings which are to be taken in conjunction with the detailed specification to follow.

DESCRIPTION OF THE PREFERRED EMBODIMENTS

Figure 1:
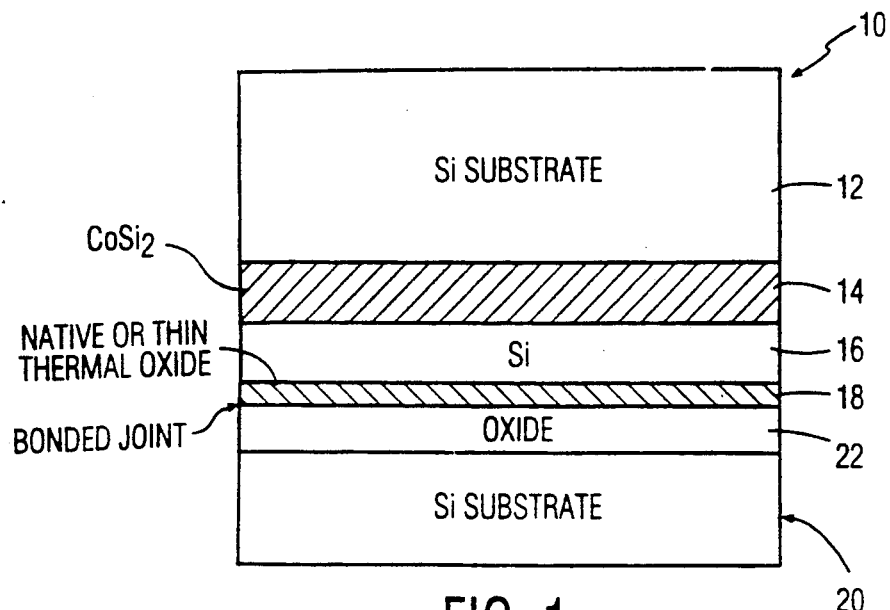
FIG. 1 is a sectional view of the silicon/metal silicide/silicide, heterostructure bonded to a second substrate.

The process for making a dielectrically isolated metal base transistors and permeable base transistors is illustrated in FIG. 1 which shows a cross-section of the semiconductor structure before it is dielectrically isolated by etching. The first portion of the process is the manufacture of a silicon/metal silicide/silicon heterostructure. In this example, the metal silicide structure is cobalt silicide. However, it is to be noted that other metal silicides may also be used as is discussed below.

The transistor to be made uses $CoSi_2$ as the base material with the emitter and collector of crystalline silicon. The process utilizes a wafer of silicon which is implanted with high doses of cobalt. In particular, implanting $3 \times 10^{17}/cm^2$ of cobalt at 170 kev followed by an annealing step at 1000° C. yields a continuous film of $CoSi_2$ buried in a silicon substrate. The silicon/cobalt silicide/silicon heterostructure 10 is thereafter bonded to a further silicon structure as is detailed below. FIG. 1 shows the original silicon substrate as layer 12, the implanted $CoSi_2$ layer is layer 14 and the outer silicon layer is layer 16. Thereafter, a thin native or thermally grown silicon oxide layer 18 is used to provide a layer for bonding to a further substrate. Alternatively $CoSi_2$ can be grown on a (111) silicon substrate by depositing a metal layer at room temperature followed by a high temperature annealing step and the epitaxial growth of an upper silicon layer.

At this point a second silicon substrate 20 is prepared and is bonded to the silicon/cobalt silicide/silicon heterostructure 10. In order to assist the bonding of substrate 20 to heterostructure 10, it is provided with an oxide layer which may be grown by any of the known methods. Thereafter, substrate 20 is bonded to heterostructure 10. By placing oxide layer 22 of substrate 20 in contact with oxide layer 18 of substrate 10 and annealing same. The annealing will cause the oxide layers of both substrates to be bonded to each other and the arrangement of layers of the two bonded substrates will be that shown in FIG. 1.

Figure 2:
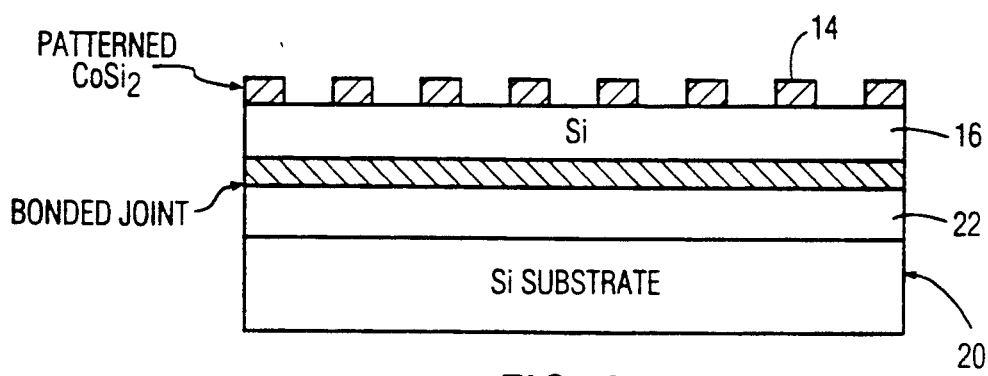
FIG. 2 is a sectional view of the bonded heterostructure with a first etching step completed.
Figure 3:
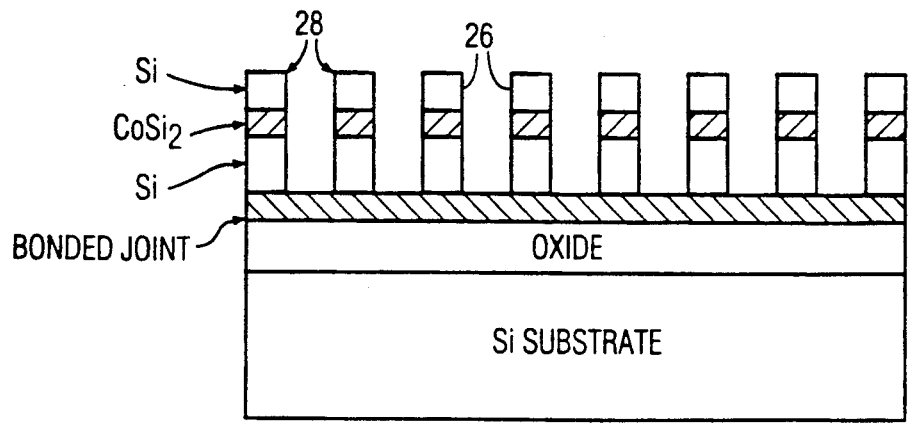
FIG. 3 is a sectional view of the completed structure comprising dielectrically isolated metal base or permeable base transistors.

As shown in FIG. 1, the uppermost layer 12 of the bonded structure is the original silicon substrate. Layer 12 is however too thick to be used as part of a transistor and it must be thinned down (as is discussed below) to a final thickness suitable for use as an active layer. As an alternative to thinning down, layer 12 may be removed completely and, in a later step, a thin silicon layer is redeposited for use as the active layer. In this alternative, silicon substrate 12 is first thinned down using a rough etch (or mechanical means) Thereafter, layer 12 is etched away with $CF_4$ plasma which selectively etches silicon with the $CoSi_2$ acting as an etch stop. This is because $CF_4$ plasma selectively etches silicon over $CoSi_2$ with a selectivity of more than 100 to 1 which will expose the layer of $CoSi_2$ as shown in FIG. 2. The silicide layer 14 can now be patterned with an appropriate mask and unmasked portions can be etched using HF or boiling concentrated HCl. Neither of these two solvents will attack the underlying silicon layer 16. Finally, an etchant that acts on silicon (such as $CF_4$ plasma) is used to etch away of the exposed portions of silicon layer 16. Thereafter a thin silicon layer 26 is grown on the silicide layer 14 with the gaps between the individual transistors appropriately masked so that the structure will resemble that shown in FIG. 3. In FIG. 3, it is seen that there are a plurality of individual transistors 28 upstanding from the oxide layer. These upstanding individual transistors 28 are both dielectrically and physically isolated from one another. Conductors may then be deposited to interconnect transistors 28 in the desired manner.

The above methodology for manufacturing dielectrically isolated metal base transistors is equally applicable to either metal base transistors or permeable base transistors. The difference lies in the processing and manufacture of the silicon/metal silicide/silicon heterostructure. Different processing and manufacture of the heterostructure will cause it to be either permeable or impermeable. For example, the production of the heterostructure via the implanting of cobalt beneath the surface of a silicon layer will generally provide material which contains pin holes and thus is a permeable base transistor. A method of providing a non-permeable base transistor is the room temperature co-deposition of silicon and cobalt in a stoichiometric ratio (2:1), followed by the deposition of an amorphous silicon capping layer and subsequent annealing of the heterostructure at an elevated temperature. This processing will provide a heterostructure which is essentially pin hole free. Further details of this process may be found in the paper "Room-Temperature Co-deposition Growth Technique for Pin Hole Reduction in Epitaxial $CoSi_2$ on Si(111)" *Applied Physics Letters,* 52 (10) Mar. 7, 1988. Other methodologies for providing either permeable or pin hole free heterostructures may be used in accordance with the present invention.

The present invention is not limited to the use of $CoSi_2$ as the epitaxial silicide/silicon device. A variety of other metal silicides such as $NiSi_2$, $FeSi_2$, $IrSi_3$, and/or PtSi could be used in place of cobalt silicide. Additionally, other than using $CF_4$ as etchant for selectively etching silicon other wet etching or reactive ion etching techniques may also be used. Finally, instead of removing the upper silicon layer (which was the original substrate) the layer could be milled down to the appropriate thickness using precision grinding techniques to form the upper active silicon layer. Thereafter the thinned layer is patterned and processed as discussed above to form the individual transistors.

Although the present invention has been described in conjunction with preferred embodiments, it is to be understood that modifications and variations may be resorted to without departing from the spirit and scope of the invention, as those skilled in the art will readily understand. Such modifications and variations are considered to be within the purview and scope of the invention and the appended claims.

What is claimed is:

1. A method for manufacturing a dielectrically isolated metal silicide transistor comprising the steps of:
    a) producing a silicon/metal silicide/silicon heterostructure;
    b) bonding the silicon/metal silicide/silicon heterostructure to an insulating substrate;
    c) masking the heterostructure; and
    d) etching through selected portions of the heterostructure to provide free standing transistors which are separated from each other and disposed on said substrate.

2. The method as claimed in claim 1, further including the step of removing the upper silicon layer of the heterostructure after bonding and redepositing an upper active silicon layer.

3. The method as claimed in claim 1, wherein the bonding step comprises the steps of oxidizing each of the said heterostructure and said substrate, disposing said oxidized surfaces in contact with each other and annealing same.

4. The method as claimed in claim 1, wherein said silicon/metal silicide/silicon heterostructure is produced by implantation of cobalt within a silicon wafer and annealing same so as to provide a buried metal silicide layer.

5. The method as claimed in claim 1, wherein said heterostructure comprises a silicon/cobalt silicide/silicon heterostructure.

6. The method as claimed in claim 1, wherein said heterostructure is produced by the co-deposition of silicon and a metal followed by an epitaxial deposition of an upper silicon layer.

* * * * *